(12) United States Patent
Hoffman

(10) Patent No.: US 9,265,331 B1
(45) Date of Patent: Feb. 23, 2016

(54) WEARABLE CARRYING CASE

(75) Inventor: Mark R. Hoffman, Lake Forest, IL (US)

(73) Assignee: HD Electric Company, Waukegan, IL (US)

( * ) Notice: Subject to any disclaimer, the term of this patent is extended or adjusted under 35 U.S.C. 154(b) by 862 days.

(21) Appl. No.: 12/691,553

(22) Filed: Jan. 21, 2010

(51) Int. Cl.
 *A45F 5/00* (2006.01)
 *A45C 11/00* (2006.01)
 *A45C 11/18* (2006.01)

(52) U.S. Cl.
 CPC ............. *A45F 5/00* (2013.01); *A45C 2011/003* (2013.01); *A45C 2011/186* (2013.01); *A45F 2005/006* (2013.01)

(58) Field of Classification Search
 CPC .................. A45C 2011/003; A45C 2011/186; A45F 2005/006
 USPC ................. 224/600, 607, 196, 257, 930, 623; 206/720
 See application file for complete search history.

(56) References Cited

U.S. PATENT DOCUMENTS

| | | | |
|---|---|---|---|
| 3,309,690 A | 3/1967 | Moffitt | |
| 3,369,175 A | 2/1968 | Morris | |
| 3,774,110 A | 11/1973 | Roveti | |
| 3,786,468 A | 1/1974 | Moffitt | |
| 3,790,406 A * | 2/1974 | Sakai et al. | 427/58 |
| 3,878,459 A | 4/1975 | Hanna | |
| 4,006,409 A | 2/1977 | Adams | |
| 4,349,783 A | 9/1982 | Robson | |
| 4,350,951 A | 9/1982 | Jasper | |
| 4,593,736 A * | 6/1986 | Morita | 150/147 |
| 4,605,905 A | 8/1986 | Aslan | |
| 4,649,375 A | 3/1987 | Duppong et al. | |
| 5,093,651 A | 3/1992 | Thomas | |
| 5,103,165 A | 4/1992 | Sirattz | |
| 5,168,265 A | 12/1992 | Aslan | |
| 5,252,912 A | 10/1993 | Merritt et al. | |
| 5,256,960 A | 10/1993 | Novini | |
| 5,363,045 A | 11/1994 | Martin et al. | |
| 5,373,284 A | 12/1994 | Aslan | |
| 5,373,285 A | 12/1994 | Aslan | |
| 5,414,344 A | 5/1995 | Chinn | |
| 5,600,307 A | 2/1997 | Aslan | |
| 5,666,949 A | 9/1997 | Debe et al. | |
| 5,708,970 A | 1/1998 | Newman et al. | |

(Continued)

OTHER PUBLICATIONS

Storm King Mountain V-Watch Fire Personal Voltage Detector Mfr. By: HD Electric Company, Model No. VWP-05-SKM Instruction Manual, undated, Storm King Mountain, Camarillo, CA, 12 pages.

(Continued)

*Primary Examiner* — J. Gregory Pickett
*Assistant Examiner* — John Cogill
(74) *Attorney, Agent, or Firm* — McDonnell Boehnen Hulbert & Berghoff LLP

(57) ABSTRACT

A case for enclosing an electric device, such as a personal voltage detector is provided. Embodiments of the case can increase safety and convenience to wearers operating near high-voltage electric lines, and combine (i) the ability to wear the case in either an open or closed position around a user's neck, (ii) the ability to adjust the position of the case, when either open or closed, to an appropriate mid-chest or mid-torso position, (iii) the ability to use the device when the case is open and worn around a user's neck and the device is inside the case, and (iv) an electrically shielded enclosure. When closed, the case can disable the electric device, allowing the device to be always on.

25 Claims, 3 Drawing Sheets

(56) References Cited

U.S. PATENT DOCUMENTS

| | | | |
|---|---|---|---|
| 5,758,401 A * | 6/1998 | Nelson | 29/460 |
| D398,777 S * | 9/1998 | Epstein | D3/218 |
| 5,799,851 A * | 9/1998 | Wulf et al. | 224/583 |
| D407,032 S | 3/1999 | McDonald | |
| 6,006,915 A * | 12/1999 | Moor | 206/579 |
| D430,546 S | 9/2000 | Gibson | |
| 6,123,240 A * | 9/2000 | Fowles et al. | 224/600 |
| D439,537 S | 3/2001 | Ternovits | |
| 6,329,924 B1 | 12/2001 | McNulty | |
| D472,387 S * | 4/2003 | Hassett | D3/301 |
| 6,659,320 B1 * | 12/2003 | Alves et al. | 224/581 |
| 6,681,972 B1 * | 1/2004 | Tapocik | 224/602 |
| 7,075,798 B2 * | 7/2006 | Hendrickson | 361/818 |
| 7,204,398 B1 * | 4/2007 | Smith, Sr. | 224/607 |
| 7,575,137 B1 * | 8/2009 | Lederer et al. | 224/601 |
| 7,635,089 B2 * | 12/2009 | Augustinowicz et al. | 235/486 |
| 7,782,206 B2 * | 8/2010 | Burnett et al. | 340/572.1 |
| 8,718,729 B1 * | 5/2014 | Kershenstein | 455/575.8 |
| 2002/0153400 A1 * | 10/2002 | Chase et al. | 224/610 |
| 2006/0254815 A1 * | 11/2006 | Humphrey et al. | 174/380 |
| 2007/0109130 A1 * | 5/2007 | Edenfield | 340/572.8 |
| 2009/0321490 A1 * | 12/2009 | Groene et al. | 224/576 |

OTHER PUBLICATIONS

Storm King Mountain V-Watch Fire AC Voltage Detector brochure, Jul. 23, 2007, Storm King Mountain, Camarillo, CA, 2 pages.

V-Watch Personal Voltage Detector Instruction Manual, 2005, HD Electric Company, Waukegan, IL, 12 pages.

V-Watch Personal Voltage Detector Instruction Manual, 2006, HD Electric Company, Waukegan, IL, 12 pages.

* cited by examiner

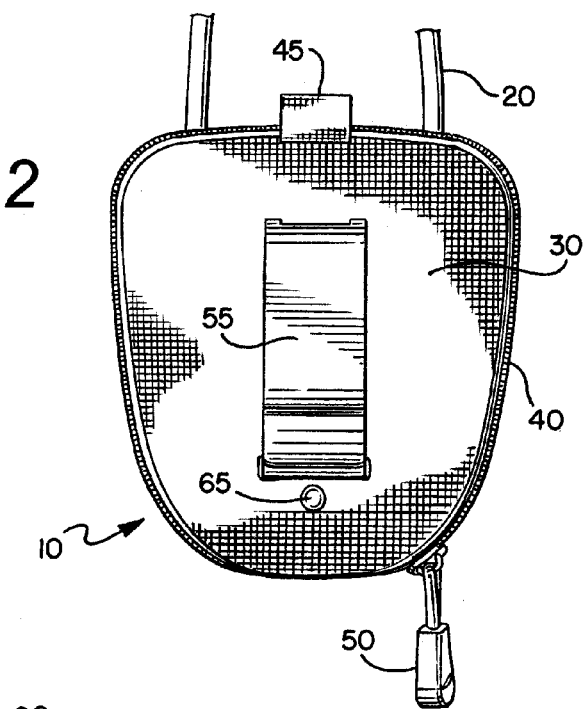
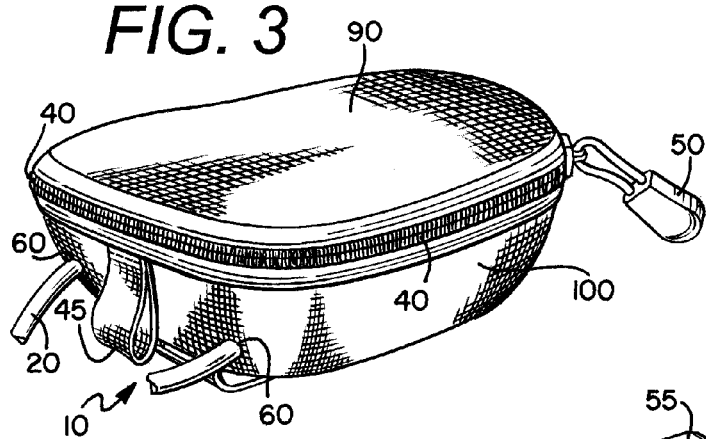
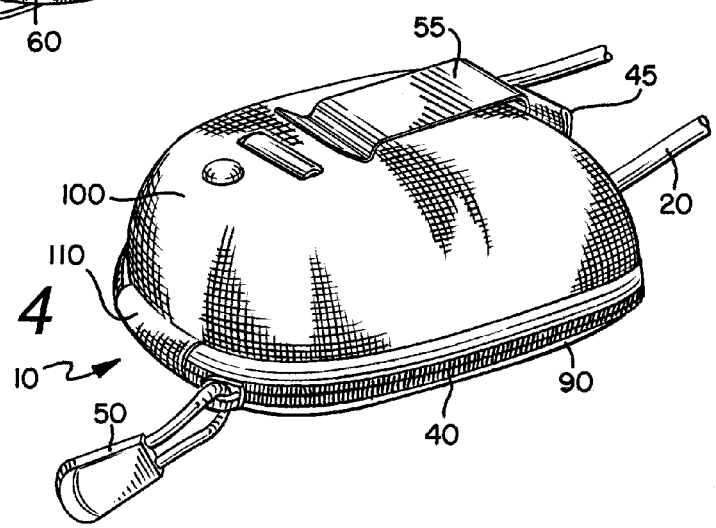

WEARABLE CARRYING CASE

BACKGROUND

1. Field of the Application

The present invention relates to cases for electric devices. The invention has particular application to monitors for electric fields, such as voltage detectors, specifically the low-frequency fields of the type which surround high-voltage conductors, such as power transmission and distribution lines.

2. Description of the Related Art

Transmission lines route high-voltage (e.g., 2000 volts and higher) electrical power from power plants to main regional stations and local substations. Distribution lines route high-voltage electrical power from substations to end users. Many such lines require frequent inspection, repair, and/or maintenance. Contact with such high-voltage power lines can be fatal for workers. Monitors and detectors exist that can sense the proximity to dangerous high-voltage power lines and that can warn workers before they reach a dangerous proximity. One such type of detector senses an electric field surrounding a high-voltage conductor, the strength and extent of such a field being proportional to the voltage level. Such detectors typically provide an audible and/or visible indication of the detected field to warn the user.

Some detectors of the personal or wearable type can be battery-powered and have on/off switches. One difficulty, particularly with detectors having audible alarm signals, is that when a worker has to work for an extended period of time in a sensed electric field, the continuous audible alarm can become annoying. Thus, workers will frequently turn off the detector, which can be dangerous. Also, a worker must remember to turn the device on each time he or she wears it, and failure to remember this is also dangerous. Other devices, which can also be battery operated, can be designed to be always on. By being always on, the device can always be checking for the presence of high voltage electric fields and can always be working to provide for the safety of its users.

U.S. Pat. No. 6,329,924 and U.S. Design Pat. No. D439,537, the disclosures of which are hereby incorporated by reference in their entirety, disclose and depict wearable electric field detectors.

SUMMARY

The present application provides a case wearable around a person's neck, the case comprising an enclosure adapted to receive an electrical device, the enclosure operable to place the case in an open position and a closed position; and an adjustable member for hanging the case around a wearer's neck and adjusting the position of the case on a wearer's upper body; and wherein in the closed position, the case electrically shields the electrical device and in the open position the case does not electrically shield the electrical device.

In another embodiment, the present application provides for a case wearable around a person's neck, the case comprising an enclosure adapted to receive an electrical device, the enclosure comprising at least one layer of electrical shielding material; and a first portion and a second portion, the first portion being movable from a closed position to an open position; and an adjustable member for hanging the case around a wearer's neck and adjusting the position of the case on a wearer's chest; and wherein in the closed position, the case electrically shields the electrical device and in the open position the case does not electrically shield the electrical device.

In another embodiment, the present application provides a method comprising positioning an electrical device and a case housing the electrical device at a mid-chest level of a user by adjusting the length of a cord member placed around the user's neck; opening the case to expose the electrical device and to enable the electrical device to sense electric fields; and closing the case to cover the electrical device and to disable the electrical device from sensing electric fields; and wherein the case includes an enclosure comprising material to electrically shield the electric device when the case is closed.

BRIEF DESCRIPTION OF THE DRAWINGS

Exemplary embodiments of the invention are described herein with reference to the drawings, in which:

FIG. 2 is a back view of the embodiment shown in FIG. 1;

FIG. 3 is a perspective view showing one side of the embodiment shown in FIG. 1;

FIG. 4 is a perspective view showing another side of the embodiment shown in FIG. 1;

DETAILED DESCRIPTION

Figure 1:
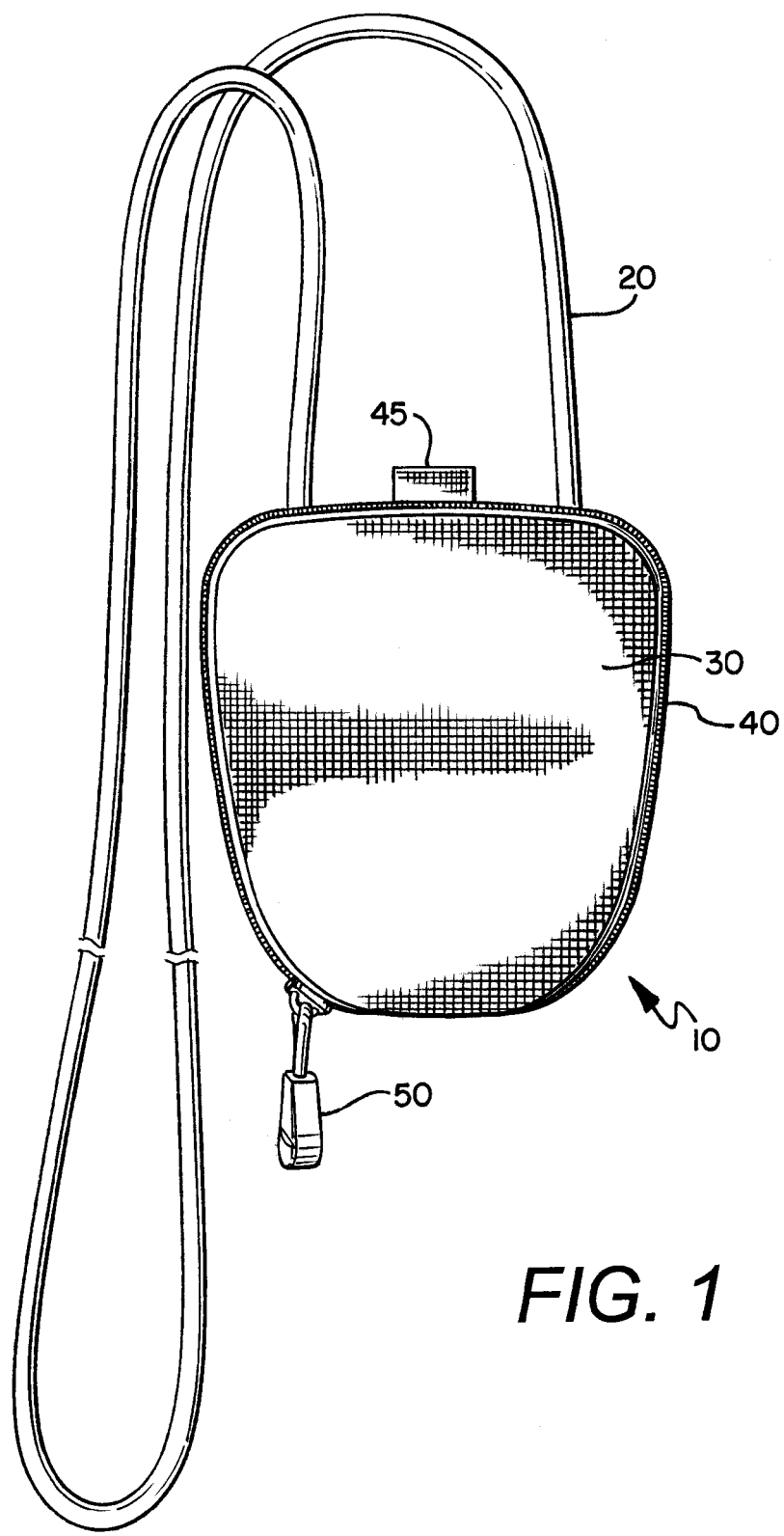
FIG. 1 is a front view of one embodiment of the present application.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

The present application provides a case for carrying a device, such as a voltage detector. One such voltage detector is a V-Watch® Personal Voltage Detector sold by HD Electric Company. In general, this device works by detecting the presence of an electric field surrounding anything that potentially conducts high voltage electricity. Once a field within range is detected, such a device can alarm by, for example, emitting loud beeps, flashing lights, and/or vibrating. Because such a device is used to detect strong electric fields surrounding high voltage conductors and power distribution equipment, it provides an additional level of safety and protection for users operating near such high voltage systems.

Such a voltage detector can work by not only sensing an electric field, but by measuring the strength of that field. Accordingly, a stronger field (due to higher voltage or closer proximity) will cause the detector to alarm from a greater distance. Moreover, as a user approaches such a voltage source, alarms such as beeping, flashes, or vibrations, can increase in intensity (for example, in frequency). A steady tone, light, or vibration can indicate very close proximity to high voltage and the need for extreme caution. Similarly, as a user moves away from such a voltage source, the alarms can decrease in intensity indicating to the user that he or she is moving away from the danger. By measuring the strength of a voltage source and providing the user an indication of that strength, the voltage detector can provide the user with an indication of source and direction (or location) of the high voltage.

Because of the sensitivity of the device and the safety it provides, it can be very important to position the device correctly for proper and accurate detection. In particular, such a device may only be sensitive to electric fields in front of the user and, to a lesser extent, to the sides of the user. Therefore, a user should not use such a device while holding it in his or her hand, because fingers wrapped around the device can block electric fields, preventing the device from working properly. In addition, a user's body, which is a good electrical conductor, can also distort or block electric fields. Accordingly, the positioning of such a device on a body and its location relative to a voltage source can have a large effect on the device's accuracy and sensitivity when detecting electric fields.

To avoid these problems, the positioning of the device on the user's body should seek to minimize or eliminate such potential distortion or blocking. Such a device should be worn on the front and center of a user's body, and a user should only move forward—in other words, the device should only be worn in the direction of work or movement. Moreover, such a device should be worn on the outside of all clothing and kept away from metal objects, such belt buckles and tools, and electronic devices such as radios, phones, and pagers.

FIG. 1 depicts an example case 10. The case 10 includes a member 20 that can be placed around a user's neck. In one embodiment, the length of member 20 is adjustable. Member 20, especially when adjustable, allows the case 10 to be worn around a user's neck and positioned on the front of the wearer's body at an appropriate height. When adjustable, a wearer can use the member 20 to position the case 10, and, accordingly, a device located within the case 10, at an ideal location, such as on the front of a user, at mid-torso or mid-chest level.

Figure 5:
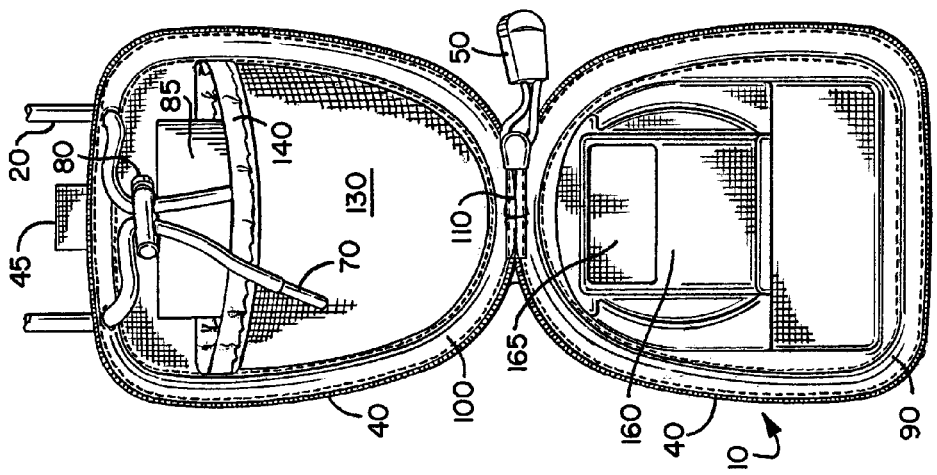
FIG. 5 is a front view of the embodiment shown in FIG. 1 in the open position with a device.

The view depicted in FIG. 1 shows the case 10 from the front, i.e., the case 10 is oriented as it would be worn on a user's upper body hanging from a user's neck, in a closed position. FIGS. 2-4 also depict the case 10 in the closed position. FIG. 2 depicts an embodiment of the case 10 viewed from the rear, i.e., viewing the side of the case 10 most likely to face the wearer. FIGS. 3 and 4 depict perspective views of each side of the case 10. FIG. 5 depicts the case 10 in an open position and housing a device 120, viewed from the front of a user.

The case 10 can include an enclosure 30 and a releasable closure 40 that, in one embodiment, can be operable to arrange the case 10 in the closed position or the open position. In particular, the releasable closure can extend around substantially the entire perimeter of the case, as shown in FIG. 1. In such a way, a wearer can use or operate the releasable closure 40 to open or close the case 10. The releasable closure 40 can, in one embodiment, be a zipper.

In the closed position of the embodiment depicted in FIG. 1, the enclosure 30 covers the device 120 located inside the case 10. The enclosure 30 can be made up of multiple layers of material, including a layer of electrical shielding material. In one embodiment, the enclosure 30 comprises an exterior surface of 600 denier polyester material and is 100% internally lined with a single piece of conductive shielding fabric, which, in one embodiment, is a 100% polyester rip-stop plane weave with a surface resistance of 0.05 ohms (A-Jin Electron Part No. WR-260-PCN, for example). Other types of shielding materials or methods are possible as well. The enclosure 30 can be relatively stiff or hard in order to protect the device 120 housed within.

In another example, the case 10 can include four layers of material. In one arrangement, the outside layer (the first layer) and the inside layer (the fourth layer) are polyester, such as the 600 denier polyester material, for example. The second layer can then be a cross-linked polyethylene foam, and the third layer can be a conductive shielding fabric. To assemble this arrangement, the layers can be glued together and formed into a sheet by the application of pressure and heat to the materials. The sheet can then be fed into a forming device to mold the sheet into the shape of the case 10 via additional heat and pressure to create a "memory" in the foam. The material is then cut and trimmed as necessary.

The electrical shielding of the enclosure 30 can shield a device inside the case 10 from electric fields. Electric fields, for example, can be caused by high voltage conductors. Such conductors may be encountered by a wearer of a personal voltage detector when inspecting, repairing, or maintaining transmission or distribution lines. Other examples are possible as well.

Figure 6:
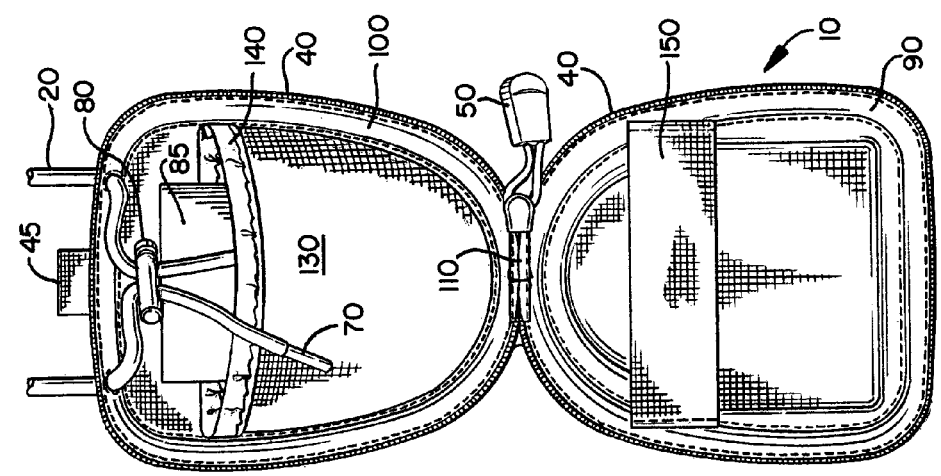
FIG. 6 is a front view of the embodiment shown in FIG. 1 in the open position without a device.

Further, the device 120 inside the case 10, can include a circuit that disables or turns the device 120 off when the device 120 is shielded from electric fields. Such a circuit is shown and described in U.S. Pat. No. 6,329,924 ("the '924 patent"), the disclosure of which is incorporated herein by reference in its entirety. Such a circuit, an embodiment of which is shown at FIG. 6 of the '924 patent, can include a sensor electrode (reference numeral 29 in FIG. 6 of the '924 patent) that can act as an antenna to pick up voltage from an electric field and, in response, can generate a low-voltage signal, which can be proportional to the strength of the sensed field.

Accordingly, when the case 10 is in a closed position, as shown in FIG. 1, electric shielding material in the enclosure 30 can shield the device 120 inside the case 10 from electric fields and disable the device 120 such that it is off, drawing reduced power, and not sensing electric fields. Alternatively, when the case 10 is in an open position, as shown in FIG. 5, the device 120 inside the case 10 will not be shielded from electric fields, will not be off, and will be enabled to sense electric fields.

As depicted in FIGS. 1-5, the releasable closure 40 can separate and join a first portion 90 and a second portion 100 of the enclosure 30. In the embodiment depicted in FIG. 5, the first portion 90 holds the device 120. As shown in FIGS. 3 and 4, the second portion 100 can form a larger portion of the enclosure 30 and/or the case 10 than does the first portion 90. In the depicted embodiments, because it holds the device 120, the first portion 90 has a flatter profile than the second portion 100. In particular, the first portion 90 includes shorter side walls (or no side walls at all) compared to those of the second portion 100 (see FIG. 3), and leaves as much of the device 120 exposed as possible to avoid interfering with the function of the device 120 and to facilitate device sensitivity and accuracy. In one embodiment, the first portion 90 has a maximum depth of ⅜ inch and is made as shallow as possible and with as little angle as possible. The second portion 100, in contrast, can have a higher profile than the first portion 90 and can even have side walls to facilitate enclosing the device 120 within the case 10 in the closed position.

In addition, because the second portion 100 of the depicted embodiments is the larger portion of the enclosure 30 of the case 10, it can accommodate other components of the case 10. For example, as depicted in FIG. 3, the second portion 100 can include holes 60 through which the member 20 can be threaded and attached to the case 10. Further, as depicted in FIG. 5, an excess length of the member 20 can be housed in the second portion 100, as can an adjustment and breakaway device 80. In addition, the second portion 100 can include a pocket 130. Of course, other embodiments of the device 120 and/or the case 10 may be, for example, flatter than the depicted embodiments, and the second portion 100 may have a correspondingly lower profile as well.

The pocket 130 may house, for example, instructions 85 and/or other documents or things, and/or the excess length of the member 20. To facilitate housing a portion of the member 20, the pocket 130 can be located in the portion of the enclosure 30 that accommodates the member 20 (which, in the depicted embodiments, is the second portion 100). In one embodiment, the pocket 130 is die cut from black vinyl fabric, is shaped similarly to the shape of the second portion 110, and is attached (such as by being sewn, for example) to a strap or piece of fabric or other material that is itself attached (such as by being sewn, for example) to the interior surface of the enclosure 30.

In addition, a top portion of the pocket 130 can be attached to a top portion of the enclosure 30, allowing a bottom portion of the pocket 130 to be pulled or swung outwardly about that attachment to provide access behind the pocket 130. Other examples of methods of attaching the pocket 130 to the case 10 are possible as well (such as by using hook and loop or Velcro fasteners, for example (which would allow the pocket 130 to be removable from the case 10)). For safety and visibility purposes, the pocket 130 can also have a reflective portion 140, which can be larger than the portion depicted and/or can cover a larger portion of the pocket 130 (such as substantially all of the visible portion of the pocket 130).

In the embodiment depicted in FIG. 5, the releasable closure 40 extends for nearly the entire perimeter of the outside of the enclosure 30 of the case 10. In the embodiments depicted, the releasable closure 40 separates the first portion 90 from the second portion 100 to form the open position (see FIG. 5, for example), and joins the first portion 90 to the second portion 100 to form the closed position (see FIG. 1, for example). When used to separate the first portion 90 from the second portion 100, the releasable closure 40 can allow the first portion 90 to rotate approximately 180 degrees away from the second portion 100 when going from the closed position to the open position. Such an arrangement allows for the enclosure 30 of the case 10 to open flat or substantially flat, allowing for full exposure of the device 120 to electric fields (facilitating accurate sensing of those fields). Moreover, because the device 120 is disposed in the first portion 90, when moved to the open position, the weight of the device can also help maintain the enclosure 30 in a flat or substantially flat open position.

In one embodiment, the releasable closure 40 is a silent slide #3 zipper sewn into the case 10 in a non-inside out manner with a plastic pull 50. The pull 50 can be large enough for a wearer who is wearing work gloves to grasp and easily operate the zipper or other releasable closure 40.

The embodiment depicted in FIG. 5 also includes a joint portion 110 of the enclosure 30 that forms a connection between the first portion 90 and the second portion 100, even when the enclosure 30 is in the open position shown in FIG. 5. The joint portion 110 can simply be a portion of the enclosure 30, or can comprise some other type of joint or hinge joining the first portion 90 and the second portion 100 of the enclosure 30 and facilitating the opening and/or closing of the enclosure 30. The joint portion 110, as well as the first portion 90 and the second portion 100, can all be lined with the conductive shielding material to help ensure full shielding of the device 120 from electric fields. In the depicted embodiments, when the first portion 90 rotates toward or away from the second portion 100, the first portion 90 rotates about the joint portion 110.

The member 20 can be attached to the case 10 and can allow a user to wear the case 10 around his or her neck. One example method of attaching the member 20 to the case 10 is depicted in FIG. 3, which shows the member 20 threaded through two holes 60 in the enclosure 30 of case 10. Turning then to FIG. 5, the member 20 can have two ends 70. In one embodiment, the member 20 can be a string like that used in a lanyard. In particular, in one embodiment, the member 20 is a ⅛ inch diameter round, flexible cord that is approximately 18 inches long when doubled over, as installed on the case 10.

As depicted in FIG. 5, the adjustment and breakaway device 80 can engage the member 20 and secure the member 20 to the case 10. The adjustment and breakaway device 80 can allow for the adjustment of the effective length of the member 20. In one embodiment, the adjustment and breakaway device 80 can be a biased, or spring loaded, device with two cylindrically shaped (or barrel shaped) components, one inside the other. Each cylindrically shaped component can have two holes, each of which can receive one end 70 of the member 20. The spring or other biasing means can then act against one of the cylindrically shaped components, such as the outside component, to bias the other cylindrically shaped component, such as the inside component. The resulting bias can firmly pinch and hold in place the portions of member 20 threaded through the holes on each cylindrically shaped component.

To adjust the effective length of the member 20 for proper positioning of the case 10 and device 120 on a user's chest or torso, a wearer can pinch the biased cylinders to overcome the biasing force and release the threaded portions of the member 20. The wearer can then slide the adjustment and breakaway device 80 along the member 20 as necessary to effectively lengthen or shorten the member 20 by pulling more or less of the member 20 through the holes on each cylindrically shaped component of the adjustment and breakaway device 80.

The adjustment and breakaway device 80 can be located inside the case 10, as depicted in FIG. 5, for example. In other embodiments, the adjustment and breakaway device 80 can be located outside the case 10 to provide the wearer with access to the device 80 even when the case 10 is closed. Other embodiments of the device 80 are possible as well, as are other structures and methods for effectively lengthening or shortening the member 20 and/or appropriately positioning the device 120 on a wearer.

In the example embodiment, the adjustment and breakaway device 80 is firmly but not fixedly attached to the member 20. In other words, the adjustment and breakaway device 80 securely sets and retains the effective length of the member 20. The adjustment and breakaway device 80, however, also provides an emergency breakaway because a strong enough pull can overcome the bias that pinches and holds the threaded portions of the member 20. Because the member 20 is placed over a wearer's neck, such a design minimizes the risk of choking or entrapment to a wearer. For example, if the member 20 or any part of the case 10 gets caught or tangled and begins to choke or entrap a wearer, the wearer can pull the member 20 out of the adjustment and breakaway device 80 (i.e., overcome the bias (without necessarily pinching the device 80) and unthread one or both ends 70 of the member 20). The one or both ends 70 would then be loose and the member 20 would no longer present a choking or entrapment risk.

Turning to FIG. 2, the case 10 can also include a clip 55. A wearer can use the clip 55 to attach the case 10 to the wearer's belt or to another location when not wearing the case 10 around his or her neck. In one embodiment, the clip 55 is a silver plated metal clip secured to the case 10 via one or more rivets 65 provided through holes punched in the case 10. Such a construction fixedly or permanently affixes the clip 55 to the case 10.

Figure 7:
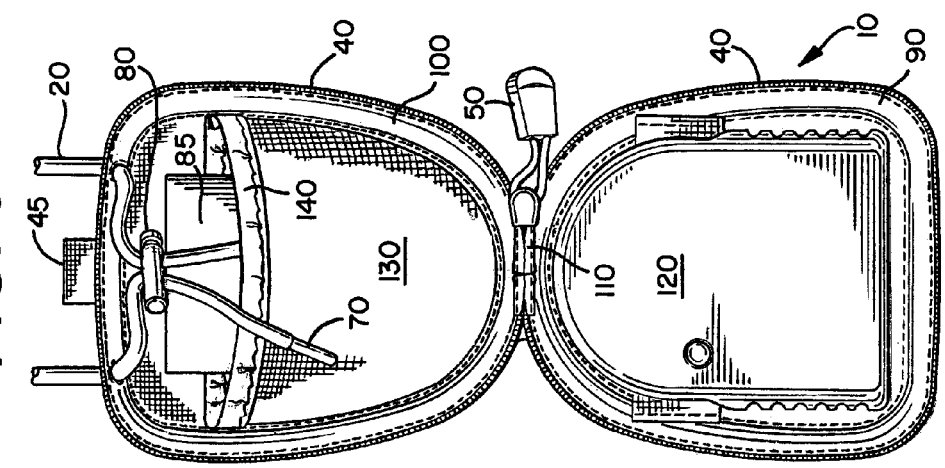
FIG. 7 is a front view of the embodiment shown in FIG. 1 in the open position without a device and with an alternate device mounting configuration.

FIGS. 6 and 7 depict front views of an open case 10 without the device 120. Both Figures also depict example mounting structures for the device 120. Generally, the device 120 can have a component or structure, such as a clip (similar to the clip 55 and/or similar to the clip depicted in FIGS. 4 and 6 of U.S. Design Pat. No. D439,537, for example), to allow mounting of the device 120 in a case such as the case 10.

FIG. 6 depicts a mounting strap 150, to which a user can mount the device 120. The mounting strap 150 can be glued or sewn into the interior surface of the enclosure 30 of the case 10. In the depicted embodiment, the mounting strap 150 is located in the first portion 90 of the enclosure 30.

FIG. 7 depicts a mounting hanger 160, to which a user can mount the device 120. In one embodiment, the mounting hanger 160 is formed of the same material as the case 10 and is glued to the interior surface of the enclosure 30 of the case 10. The mounting hanger 160 can include an opening 165 through which a clip of the device 120 can fit. In the depicted embodiment, the mounting hanger 160 is located in the first portion 90 of the enclosure 30 and is formed into a shape that will match the shape of a mounting clip on the device 120.

The mounting structures on the case 10 for the device 120, such as the mounting strap 150 and the mounting hanger 160, can be oriented such that when the case 10 is open, the device 120 will face forward and will be oriented correctly. A user may need to remove and reinsert the device 120 when, for example, changing the batteries.

The case 10 can also include a tab 45 attached to the top of the case 10. The tap 45 can receive a hook or karabiner-type device for hanging the case 10 and/or can accommodate an identification card (such as to assist with storage, for example) that may be an accessory to the case 10. In other embodiments, a member 20 can be attached to the case 10 via the tab 45 (instead, for example, of being threaded through the holes 60). In one embodiment, the tab 45 is a ¾ inch diameter fabric loop that is sewn to the external top of the case 10 between the holes 60. The tab 45 can be oriented perpendicular to the releasable closure 40, as is depicted in FIG. 3.

In operation, a user can wear the case 10 on his or her belt via the clip 55 when the device 120 is not in use. When the user is ready to use the device 120, he or she can remove the case 10 from his or her belt and place the member 20 around the user's neck. When ready to use the device 120, the user can open the case 10 by operating the removable closure 40. If necessary, the user may then run a test of the device 120 to ensure it is working properly. At any point, the user may use the adjustment and breakaway device 80 to adjust the effective length of the member 20 as appropriate (in one example, the device 120 should be worn at the user's mid-chest or mid-torso level). To disable or turn off the device 120, the user can close the case 10 by operating the removable closure 40.

Such embodiments provide advantages over cases that do not include all or some of the described features. For instance, because the shielded case 10 disables the device 120 when the device 120 is enclosed in the case 10, the device 120 does not require an on-off switch. Battery life can be saved by closing the device 120 in the case 10, disabling the device 120 when not needed. Because the case 10 allows the device 120 to be designed as always on, a user does not need to remember to turn the device 120 on when working around high voltage sources, adding to the levels of safety provided by such a device. In addition, the adjustable member 20 of the case 10 allows the case 10 and, hence, the device 120 itself, to be positioned properly at mid-chest or mid-torso of a user, again adding to the safety provided by the device 120. Moreover, embodiments in which the case 10 combines (i) the ability to wear the case 10 in either an open or closed position around a user's neck, (ii) the ability to adjust the position of the case 10, when either open or closed, to a mid-chest or mid-torso position, (iii) the ability to use the device 120 when the case 10 is open and worn around a user's neck and the device 120 is inside the case 10, and (iv) an electrically shielded enclosure 30, provide levels of safety and convenience not seen in other cases.

Additional features of the present invention include, but are not limited to, convenience, ease of use, ergonomics, sturdiness, reliability, portability, and efficiency.

While the application has been described in connection with certain embodiments, it will be understood that it is not intended to limit the invention to those particular embodiments. On the contrary, it is intended to cover all alternatives, modifications, and equivalents included within the spirit and scope of the invention as defined by the appended claims. As one example, other structures and methods of opening the case 10, including sliding a first portion away from a second portion to expose the device 120, are possible as well.

I claim:

1. A wearable case wearable around a person's neck, the case comprising:
   an electrical device
   an enclosure adapted to receive an electrical device, the enclosure operable to place the wearable case in an open position and a closed position, the enclosure further including a first portion, a second portion, and a joint portion connecting the first portion to the second portion, each of the first portion and the second portion being at least semi-rigid and comprising a plurality of material layers, including an external layer and a layer of electrical shielding material, the external layer overlaying at least the layer of electrical shielding material, wherein the first portion can rotate from the closed position to the open position about the joint portion, and the enclosure further comprising a mounting structure on the first portion for mounting the electrical device within the enclosure; and
   an adjustable member for hanging the wearable case around a wearer's neck and adjusting the position of the wearable case on a wearer's upper body;
   wherein in the closed position, the wearable case disables the electrical device by electrically shielding the device, thereby preventing the electrical device from detecting electric fields, and wherein in the open position, the wearable case does not electrically shield the electrical device to enable the device when it is mounted in the case, thereby allowing the electrical device to detect electric fields when the device is mounted in the first portion.

2. The wearable case of claim 1, further comprising an electrical device disposed within the wearable case.

3. The wearable case of claim 2, wherein the electrical device is disposed on the first portion.

4. The wearable case of claim 2, wherein the electrical device is a voltage detector.

5. The wearable case of claim 1, wherein when the wearable case is hung around a wearer's neck, the first portion rotates downwardly when rotating from the closed position to the open position.

6. The wearable case of claim 5, wherein the first portion rotates approximately 180 degrees to the open position.

7. The wearable case of claim 1, wherein the adjustable member is attached to the second portion.

8. The wearable case of claim 1 further comprising:
a releasable closure located between at least a portion of the first portion and at least a portion of the second portion, the releasable closure operable to join the first portion to the second portion in the closed position and operable to separate the first portion from the second portion in the open position; and
wherein the first portion rotates approximately 180 degrees to the open position.

9. The wearable case of claim 1, wherein the first portion can move relative to the second portion to expose the electrical device in the open position.

10. The wearable case of claim 1 wherein the mounting structure comprises a strap.

11. The wearable case of claim 1 wherein the mounting structure comprises a mounting hanger.

12. The wearable case of claim 1, wherein the layer of electrical shielding material comprises a polyester rip-stop plane weave having a surface resistance of about 0.05 Ohms.

13. The wearable case of claim 1, wherein the external layer and the layer of electrical shielding material comprise different materials.

14. A wearable case wearable around a person's neck, the wearable case comprising:
an enclosure adapted to receive an electrical device, the enclosure comprising:
a first portion and a second portion, the first portion being movable from a closed position to an open position, wherein each of the first portion and the second portion is at least semi-rigid and comprises a plurality of material layers, including an external layer and a layer of electrical shielding material, the external layer overlaying at least the layer of electrical shielding material;
an electrical device; and
a mounting structure on the first portion for mounting the electrical device within the enclosure; and
an adjustable member for hanging the wearable case and the device mounted in the first portion around a wearer's neck and adjusting the position of the wearable case and the device on a wearer's chest,
wherein in the closed position the first portion and the second portion of the wearable case substantially enclose the electrical device within the electrical shielding material such that the wearable case disables the electrical device from detecting electric fields, and wherein in the open position the first portion and the second portion of the wearable case expose the electrical device to electric fields such that the electrical device is enabled to detect electric fields while the device is mounted on the mounting structure.

15. The wearable case of claim 14, wherein the electrical device is disposed on the first portion.

16. The wearable case of claim 15, wherein the adjustable member is attached to the second portion.

17. The wearable case of claim 14, wherein the first portion can rotate downwardly when moving from the closed position to the open position; and wherein the first portion can rotate approximately 180 degrees to the open position.

18. The wearable case of claim 14, wherein the external layer and the layer of electrical shielding material comprise different materials.

19. A wearable case comprising:
an enclosure adapted to receive an electrical device, the enclosure comprising:
a first portion and a second portion, the first portion being movable from a closed position to an open position, wherein each of the first portion and the second portion is at least semi-rigid and comprises a plurality of material layers, including an external layer and a layer of electrical shielding material, the external layer overlaying at least the layer of electrical shielding material;
an electrical device; and
a mounting structure on the first portion for mounting the electrical device within the enclosure,
wherein in the closed position the first portion and the second portion of the wearable case substantially enclose the electrical device within the electrical shielding material such that the wearable case disables the electrical device from detecting electric fields, and wherein in the open position the first portion and the second portion of the wearable case expose the electrical device to electric fields such that the electrical device is enabled to detect electric fields while the device is mounted in the first portion.

20. The wearable case of claim 19, further comprising a member for hanging the wearable case around a wearer's neck.

21. The wearable case of claim 20, wherein the member is adjustable for adjusting the position of the case on the wearer's body.

22. The wearable case of claim 21 wherein the wearable case is positioned at a mid-chest level of a user.

23. The wearable case of claim 19, wherein the electrical device comprises a voltage detector.

24. The wearable case of claim 19, wherein the first portion can rotate downwardly when moving from the closed position to the open position; and wherein the first portion can rotate approximately 180 degrees to the open position.

25. The wearable case of claim 19, wherein the external layer and the layer of electrical shielding material comprise different materials.

* * * * *